(12) United States Patent
Tran et al.

(10) Patent No.: US 8,680,534 B2
(45) Date of Patent: *Mar. 25, 2014

(54) VERTICAL LIGHT EMITTING DIODES (LED) HAVING METAL SUBSTRATE AND SPIN COATED PHOSPHOR LAYER FOR PRODUCING WHITE LIGHT

(75) Inventors: Chuong A Tran, Baoshan Township (TW); Trung Tri Doan, Baoshan Township (TW)

(73) Assignee: Semileds Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/227,335

(22) Filed: Sep. 7, 2011

(65) Prior Publication Data
US 2012/0032184 A1  Feb. 9, 2012

Related U.S. Application Data

(63) Continuation-in-part of application No. 13/191,235, filed on Jul. 26, 2011, which is a continuation-in-part of application No. 11/530,128, filed on Sep. 8, 2006, now Pat. No. 8,012,774, which is a continuation-in-part of application No. 11/032,853, filed on Jan. 11, 2005, now Pat. No. 7,195,944.

(51) Int. Cl.
*H01L 33/02* (2010.01)

(52) U.S. Cl.
USPC ..................................... 257/76; 257/E33.023

(58) Field of Classification Search
USPC .......................... 257/76, 98, E33.023, 89–96
See application file for complete search history.

(56) References Cited

U.S. PATENT DOCUMENTS

| | | | |
|---|---|---|---|
| 5,959,316 A | 9/1999 | Lowery | |
| 5,998,925 A | 12/1999 | Shimizu et al. | |
| 6,071,795 A | 6/2000 | Cheung et al. | |
| 6,221,683 B1 | 4/2001 | Nirschl et al. | |
| 6,417,019 B1 | 7/2002 | Mueller et al. | |
| 6,501,102 B2 | 12/2002 | Mueller-Mach et al. | |
| 6,504,181 B2 | 1/2003 | Furukawa et al. | |
| 6,576,488 B2 * | 6/2003 | Collins et al. | 438/29 |
| 6,641,448 B2 | 11/2003 | Wang et al. | |
| 6,642,652 B2 | 11/2003 | Collins, III et al. | |
| 6,658,041 B2 | 12/2003 | Uebbing | |

(Continued)

FOREIGN PATENT DOCUMENTS

| | | |
|---|---|---|
| WO | WO2004/040661 | 5/2004 |
| WO | WO2005/029572 A1 | 3/2005 |
| WO | WO2005/029573 A1 | 3/2005 |

OTHER PUBLICATIONS

PCT International Search Report for International Application No. PCT/US06/00357 dated Oct. 2, 2007.

(Continued)

*Primary Examiner* — Matthew W Such
*Assistant Examiner* — Monica D Harrison
(74) *Attorney, Agent, or Firm* — Stephen A. Gratton

(57) ABSTRACT

A vertical light-emitting diode (VLED) includes a metal substrate, a p-electrode coupled to the metal substrate, a p-contact coupled to the p-electrode, a p-GaN portion coupled to the p-electrode, an active region coupled to the p-GaN portion, an n-GaN portion coupled to the active region, and a phosphor layer coupled to the n-GaN portion.

12 Claims, 5 Drawing Sheets

(56) References Cited

U.S. PATENT DOCUMENTS

| | | |
|---|---|---|
| 6,734,466 B2 | 5/2004 | Chua |
| 6,744,071 B2 | 6/2004 | Sano et al. |
| 6,744,196 B1 | 6/2004 | Jeon |
| 6,770,542 B2 | 8/2004 | Plossl et al. |
| 6,800,500 B2 | 10/2004 | Coman et al. |
| 7,045,956 B2 | 5/2006 | Braune et al. |
| 7,301,175 B2 * | 11/2007 | Izuno et al. .............. 257/98 |
| 7,385,349 B2 * | 6/2008 | Daicho et al. ............ 313/512 |
| 7,646,033 B2 * | 1/2010 | Tran et al. ................ 257/94 |
| 8,018,774 B2 | 9/2011 | Tran et al. |
| 2002/0074558 A1 * | 6/2002 | Hata et al. ................ 257/89 |
| 2002/0076904 A1 | 6/2002 | Imler |
| 2002/0089058 A1 | 7/2002 | Hedler et al. |
| 2002/0185965 A1 | 12/2002 | Collins et al. |
| 2004/0077114 A1 | 4/2004 | Coman et al. |
| 2004/0135158 A1 | 7/2004 | Hon |
| 2004/0188696 A1 | 9/2004 | Hsing Chen et al. |
| 2004/0235210 A1 | 11/2004 | Tamura et al. |
| 2004/0245543 A1 | 12/2004 | Yoo |
| 2005/0057145 A1 * | 3/2005 | Shieh et al. ............... 313/503 |
| 2005/0093008 A1 | 5/2005 | Suehiro et al. |
| 2005/0173692 A1 | 8/2005 | Park et al. |
| 2006/0003477 A1 | 1/2006 | Braune et al. |
| 2006/0061259 A1 | 3/2006 | Negley |
| 2006/0091409 A1 | 5/2006 | Epler et al. |
| 2011/0284866 A1 | 11/2011 | Tran et al. |

OTHER PUBLICATIONS

Final Office Action in U.S. Appl. No. 13/191,235 dated Apr. 10, 2013, pp. 1-8.

Non-Final Office Action in U.S. Appl. No. 13/191,235 dated Nov. 20, 2012, pp. 1-9.

* cited by examiner

US 8,680,534 B2

VERTICAL LIGHT EMITTING DIODES (LED) HAVING METAL SUBSTRATE AND SPIN COATED PHOSPHOR LAYER FOR PRODUCING WHITE LIGHT

CROSS-REFERENCE TO RELATED APPLICATIONS

This application is a continuation-in-part of U.S. patent application Ser. No. 13/191,235, filed Jul. 26, 2011, which is a continuation-in-part of U.S. patent application Ser. No. 11/530,128, filed Sep. 8, 2006, now U.S. Pat. No. 8,012,774, which is a continuation-in-part of U.S. patent application Ser. No. 11/032,853, filed Jan. 11, 2005, now U.S. Pat. No. 7,195,944, which are all herein incorporated by reference in their entirety.

BACKGROUND OF THE INVENTION

1. Field of the Invention

Embodiments of the present invention generally relate to light-emitting diodes (LEDs) and methods for fabricating the same.

2. Description of the Related Art

Advances in light emitting diode (LED) technology have resulted in LEDs with characteristics of small volume, light weight, high efficiency, and long life. These LEDs have seen great advances in different monochromatic color output, such as red, blue and green. Single color LEDs can be used as a backlight in a special display, for instance, in mobile phones and light crystal displays (LCDs).

Recently, various attempts have been made to make white light sources by using light emitting diodes. Because the light emitting diode has an emission spectrum well-suited to generate monochromatic light, making a light source for white light may involve arranging three light emitting components of red (R), green (G), and blue (B) near each other while diffusing and mixing the light emitted by them. When generating white light with such an arrangement, there has been the problem that white light of the desired tone cannot be generated due to variations in the tone, luminance, and other factors of the light emitting component. Also, when the LEDs are made of different materials, electric power required for forward biasing differs from one light emitting diode to another, making it necessary to apply different voltages to different light emitting components, which leads to complex drive circuitry. Moreover, because the light emitting components are semiconductor light emitting components, color tone is subject to variation due to differences in temperature characteristics, chronological changes, and operating environment. Unevenness in color may also be caused by failure to uniformly mix the light emitted by the light emitting components. Thus, LEDs are effective as light emitting devices for generating individual colors, but a satisfactory light source capable of emitting white light by using LEDs has not been obtained so far.

U.S. Pat. No. 5,998,925 discloses a white light emitting diode having a light emitting component that uses a semiconductor as a light emitting layer and a phosphor, which absorbs part of the light emitted by the light emitting component and emits light of a wavelength different from that of the absorbed light. The light emitting layer of the light emitting component is a nitride compound semiconductor, and the phosphor contains garnet fluorescent material activated with cerium—which contains at least one element selected from the group consisting of Y, Lu, Sc, La, Gd, and Sm and at least one element selected from the group consisting of Al, Ga, and In—and is subject to less deterioration of its emission characteristics, even when used with high luminance for a long period of time.

FIG. 1 shows an LED as disclosed in the '925 patent. This LED is a lead-type LED having a mount lead 2 and an inner lead 4, wherein a light emitting component 8 is installed on a cup 6 of the mount lead 2, and the cup 6 is filled with a coating resin 14 that contains a specified phosphor to cover the light emitting component 8 and is molded in resin. An n-electrode and a p-electrode of the light emitting component 8 are connected to the mount lead 2 and the inner lead 4, respectively, by means of wires 12. In the LED constituted as described above, part of the light emitted by the light emitting component (LED chip) 8 (hereinafter referred to as LED light) excites the phosphor contained in the coating resin 14 to generate fluorescent light having a wavelength different from that of LED light, so that the fluorescent light emitted by the phosphor and the LED light that is output without contributing to the excitation of the phosphor are mixed and output. As a result, the LED also outputs light having a wavelength different from that of the LED light emitted by the light emitting component 8.

FIG. 2 shows a chip embodiment as disclosed in the '925 patent. The chip-type LED 26 is installed in a recess of a casing 22, which is filled with a coating material containing a specified phosphor to form a coating 28. The light emitting component 26 is fixed by using an epoxy resin or the like which contains Ag, for example, and an n-electrode and a p-electrode of the light emitting component 26 are connected to metal terminals 20 installed on the casing 22 by means of conductive wires 24. In the chip-type LED constituted as described above, similar to the lead-type LED of FIG. 1, fluorescent light emitted by the phosphor and LED light that is transmitted without being absorbed by the phosphor are mixed and output, so that the LED outputs light having a wavelength different from that of LED light emitted by the light emitting component 26. This type of conventional LED suffers from a color ring when used for emitting white light, whereby the color of the emitted light is bluer towards the middle and tends toward yellow at the edges near the casing 22.

U.S. Pat. No. 6,642,652 discloses a light source that includes a light emitting device—such as a III-nitride LED where Group 3 (III) includes such elements as Al, Ga, and In—covered with a luminescent material structure, such as a single layer or multiple layers of phosphor. Any variations in the thickness of the luminescent material structure are less than or equal to 10% of the average thickness of the luminescent material structure. In some embodiments, the thickness of the luminescent material structure is less than 10% of a cross-sectional dimension of the light emitting device. In some embodiments, the luminescent material structure is the only luminescent material through which light emitted from the light emitting device passes. In some embodiments, the luminescent material structure is between about 15 and about 100 microns thick. The luminescent material structure is selectively deposited on the light emitting device, for example, by stenciling or electrophoretic deposition.

An LED coated with phosphor according to the '652 patent is illustrated in FIG. 3. This LED includes an n-type region 44 formed on a substrate 42, such as sapphire, SiC, or a III-nitride material. An active region 46 is formed on the n-type region 44, and a p-type region 36 is formed on the active region 46. The n-type region 44, the active region 46, and the p-type region 36 are typically multilayer structures. Portions of the p-type region 36, the active region 46, and the n-type region 44 are etched away to expose a portion of n-type region 44. A p-type contact 34 is deposited on the p-type region 36, and an n-type contact 38 is deposited on the exposed portion of the n-type region 44. The LED is then flipped over and mounted to a sub-mount 30 by a material 32, such as solder. The luminescent material structure 40, such as phosphor, is deposited using electrophoresis to surround the LED at the individual die level.

U.S. Pat. No. 6,744,196 discloses thin film LED devices composed of LED chips that emit light at a first wavelength and a tinted thin film layer over the LED chip that changes the color of the emitted light. For example, a blue-light emitting LED chip can be used to produce white light. The tinted thin film layer beneficially consists of ZnSe, $CeO_2$, $Al_2O_3$, or $Y_2O_3Ce$ that is deposited using a chemical vapor deposition (CVD) process, such as metal organic chemical vapor deposition (MOCVD), atomic layer chemical vapor deposition (ALD), plasma enhanced MOCVD, plasma enhanced ALD, and/or photo enhanced CVD. As shown in FIG. 4, an n-contact 50 is positioned below a reflective layer 52. A tinted layer (a phosphor layer) 53 is positioned above the reflective layer 52. Next, a first passivation layer 54 is formed, and a p-type semi-transparent contact 56 is formed. A second passivation layer 58 is formed above the first passivation layer 54 and contact 56. A conductive wire 60 is connected to a p-pad 62, which is positioned above the p-lead 64.

Accordingly, what is needed is an improved semiconductor light source capable of emitting white light.

SUMMARY

A vertical light emitting diode (VLED) includes a metal substrate; a p-electrode coupled to the metal substrate; a p-GaN portion coupled to the p-electrode; an active region coupled to the p-GaN portion; an n-GaN portion coupled to the active region; and a phosphor layer coupled to the n-GaN portion.

Implementations of the above LED can include one or more of the following. The metal substrate with a mirror layer is formed on top of the p-GaN portion; using laser lift-off (LLO), selective wet etching, or chemical mechanical polishing, the sapphire carrier is removed. The p-contact can also be a light reflector. The phosphor layer can be spin-coated or screen printing with a phosphor powder or paste. The phosphor layer is patterned using a masking material 101 such as photo resist and dry etched using a fluorine-containing plasma; then a metal layer (e.g., comprising Cr/Ni) is applied to form a contact with n-GaN using various techniques such as PVD, ebeam evaporation, or CVD; the metal bond pad 98 is formed as a contact with n-GaN after the resist 101 is removed and lift-off the unwanted areas of metal 99 to form bond pad 98. This is called resist lift-off techniques. The phosphor layer and the bond pad cover the exposed n-GaN surface 80.

Advantages of the invention may include one or more of the following. The above LED wafer surface with exposed n-GaN portion 80 layer is a substantially smooth, planar surface for subsequent processing. The method lowers the cost of producing white LED by coating the phosphor on the blue LEDs at the wafer level directly on top of exposed n-GaN surface, as compared to conventionally coating one LED die at a time. The method reduces the amount of phosphor indicated for each die by covering only the exposed n-GaN surface. The LEDs do not require wafer bonding or gluing, and the complex and lengthy one-at-a-time wafer bonding/gluing process is replaced by a less complex deposition process such as physical vapor deposition (PVD), chemical vapor deposition (CVD), plasma enhanced CVD (PECVD), evaporation, ion beam deposition, electro chemical deposition, electroless chemical deposition, plasma spray, or ink jet deposition. No semi-transparent contact is needed for the n-electrode since n-GaN conductivity is good, and as a result, more light output can be emitted from the LED device. Further, since only one electrode is needed on each side of the device, the LED electrode obstructs less light. Additionally, current can spread out uniformly from n-electrode to p-electrode, thus increasing LED performance. Moreover, the metal substrate can dissipate more heat than the sapphire substrate, so more current can be used to drive the LED. The resulting LED can replace the conventional LED at a smaller size. For the same LED size, the light output from the vertical LED is significantly higher than the conventional LED for the same drive current.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

With reference to the accompanying drawings, embodiments of the present invention will be described. In reading the detailed description, the accompanying drawings may be referenced at the same time and considered as part of the detailed description.

Figure 1:
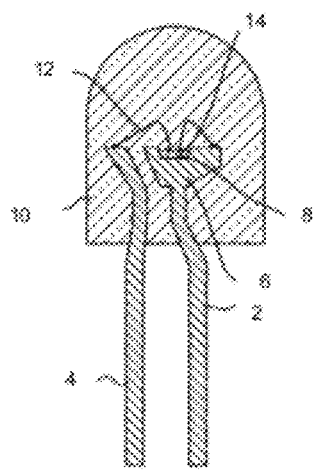
FIGS. 1-4 show various prior art light-emitting diodes (LEDs).
Figure 2:
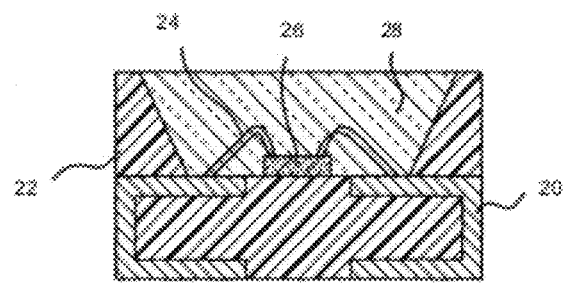
Figure 3:
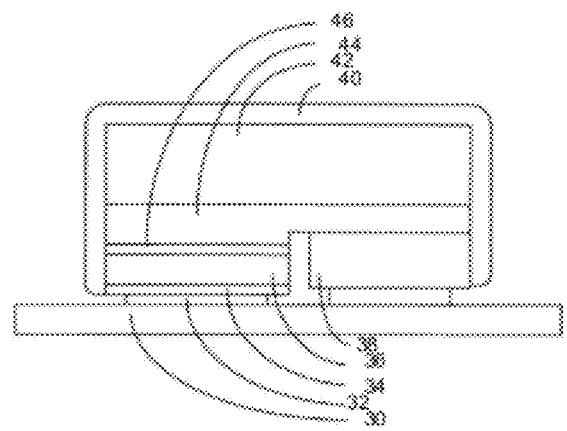
Figure 4:
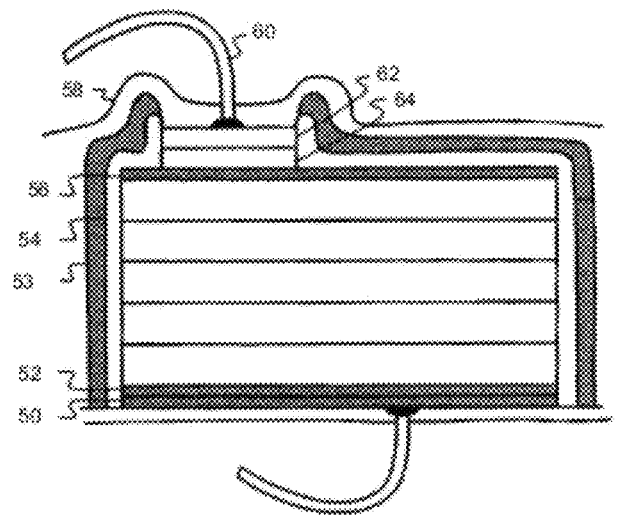
Figure 5:
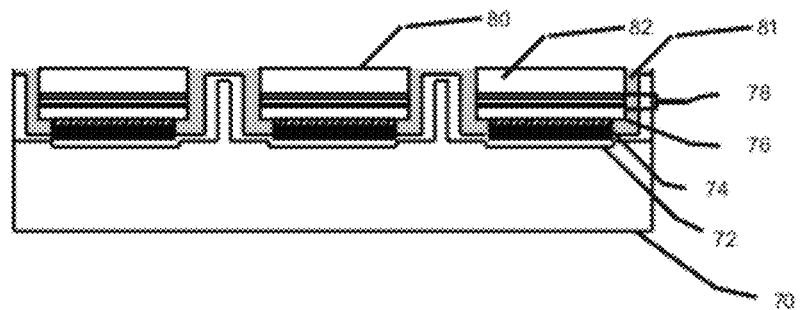
FIG. 5 shows a first embodiment of a vertical LED (VLED) in accordance with one embodiment of the invention.

FIG. 5 shows an exemplary structure of one embodiment of a vertical-LED wafer. Each LED includes a metal substrate 70 made from a laser lift-off process. A p-electrode 72 is positioned above the metal substrate 70. Next, a light reflector and p-contact 74 and a p-GaN portion 76 are positioned above the p-electrode 72. An active region 78 (including a multi-quantum well (MQW)) is formed, and an n-GaN portion 82 is formed above the active region 78. The n-GaN has an exposed surface 80.

The LED is formed by depositing a multilayer epitaxial structure above a carrier substrate such as sapphire; depositing at least one metal layer above the multilayer epitaxial structure to form a metal substrate 70; and removing the carrier substrate to leave the metal substrate 70. The one or more metal layers can be deposited using electro chemical deposition, electroless chemical deposition, chemical vapor deposition (CVD), metal organic CVD (MOCVD), plasma enhanced CVD (PECVD), atomic layer deposition (ALD), physical vapor deposition (PVD), evaporation, or plasma spray, or any combination of these techniques. The metal substrate 70 can be single or multi-layered. The one or more metal layers may comprise any of various suitable metals, such as at least one of silver (Ag), aluminum (Al), titanium tungsten (TiW), tungsten (W), molybdenum (Mo), tantalum (Ta), tantalum nitride (TaN), or alloys thereof. In one embodiment, Ag/Pt or Ag/Pd or Ag/Cr is used as a mirror layer, nickel (Ni) is used as a barrier for gold (Au) as a seed layer for copper (Cu) plating, which is used as the bulk substrate. The mirror layer (comprising Ag, Al, Pt, Ti, or Cr, for example) is deposited, and then a barrier layer comprising any of various suitable materials (such as TiN, TaN, TiWN, TiW with oxygen) is formed above the mirror layer before electro or electroless chemical deposition of a metal, such as Ni or Cu. For electrochemical deposition of copper, a seed layer is deposited using CVD, MOCVD, PVD, ALD, or evaporation process; some of the seed materials for copper are tungsten (W), Au, Cu, or Ni, among others. The metal layers may have the same or different composition and may be deposited using various deposition techniques. The carrier substrate removal can be done using laser, etching, grinding/lapping, chemical mechanical polishing, or wet etching, among others.

The sapphire substrate can be removed using laser lift-off (LLO) technique. The multilayer epitaxial layer can have a reflective metal layer coupled to the metal plating layer. A passivation layer 81 is passivating the sidewall of the LED dies and may be coupled to the reflective metal layer (which may function as the p-contact 74), p-electrode 72, p-GaN portion 76, MQW (e.g., the active region 78), and n-GaN portion 82. A p-GaN layer may be coupled to the passivation layer, an n-GaN layer may be coupled to the MQW layer, and an n-electrode may be coupled to the n-GaN layer. The metal plating layer may function as a p-electrode or may have a p-electrode coupled thereto.

Figure 6:
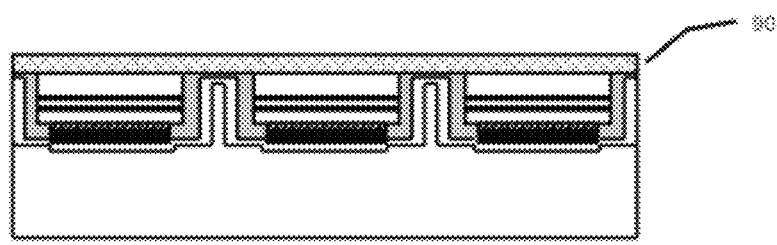
FIG. 6 shows the LED of FIG. 5 with a phosphor coating thereon, in accordance with one embodiment of the invention.

FIG. 6 shows phosphor coating 90 on the vertical LED (VLED). Since the LED wafer is substantially smooth and planar, the wafer-level phosphor coating is uniform and parallel to the emitting LED surface 80. Therefore, color rings do not exist on the LED's field pattern because the blue light emitted from the active layers travels the same distance or light paths through the phosphor layer. In addition, the LED thickness (GaN layer total thickness is about 2 μm to 8 μm) is much smaller than the emitting surface of the n-GaN portion 82 (typically greater than 50 μm). Light is mainly emitted from the top surface, and a few photons are emitted from the sidewall to minimize issues arising from uneven thickness of the phosphor layer 90.

The phosphor layer 90 can be formed using a spin coater. The phosphor layer 90 can be coated by the spin-coater spinning between 500 to 30000 rpm to control the layer thickness on the n-side-up vertical-LED wafer. In addition to the spin coat method, other methods such as screen printing, roller method, or dipping method can be used. In particular, to obtain a predetermined equal film thickness, the spin coat method is preferably used. After the phosphor is coated on the substrate, the coated film is dried. The drying method is not limited as long as moisture of the film is evaporated. Thus, various methods using a heater, dried air, or surface treatment such as a radiant heat lamp can be used. Alternatively, the coated film may be dried by leaving it in a room temperature environment for a long time.

To make the phosphor coating, a phosphor powder composition is prepared. For this purpose, for example, a dispersing agent is dispersed in purified water, and the dispersion is stirred with a homomixer and placed in the purified water in which the dispersing agent has been dispersed, and the mixture is stirred. In the phosphor powder composition, water can be used as a dispersing medium. The phosphor powder composition may contain alcohol as a dispersing agent or a retaining agent, and ammonium bi-chromate may be used as a photosensitive polymer. The phosphor powders may be surface-treated on their manufacturing process, for improving the dispersing property and adhesion thereof. The phosphor coating material is composed by the phosphor elements mixed in organic chemicals such as alcohol, aerosol, binder material or resin epoxy to tune the viscosity of the coating material. The thickness can be tuned by the material viscosity and spin rate reproducibly to change the resulting CIE coordination of the white light LEDs. Next, a photoresist layer 101 is applied and exposed with a contact pattern, and then the phosphor layer 90 is etched. The etching can include a dry etching method.

Figure 7:
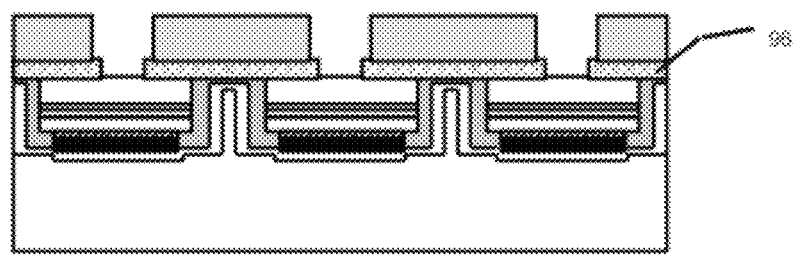
FIG. 7 shows a patterned phosphor coating with a photoresist masking layer, in accordance with one embodiment of the invention.

FIG. 7 shows patterned phosphor layer with a masking photo resist masking layer. A patterned phosphor layer 96 is formed on the exposed n-GaN surface 80. The patterned phosphor layer 96 can be patterned using a dry etching process. In the dry etching process, a photoresistive mask is placed over the phosphor thin films, and the thin films are exposed to a corrosive gas within an electric field. The mask can include photoresistive strips corresponding to the dimensions of the phosphor segments. The result of the etching is a plurality of openings for a contact opening for later depositing a contact metal layer 99 such as Ni/Cr (Ni is in contact with n-GaN).

Figure 8:
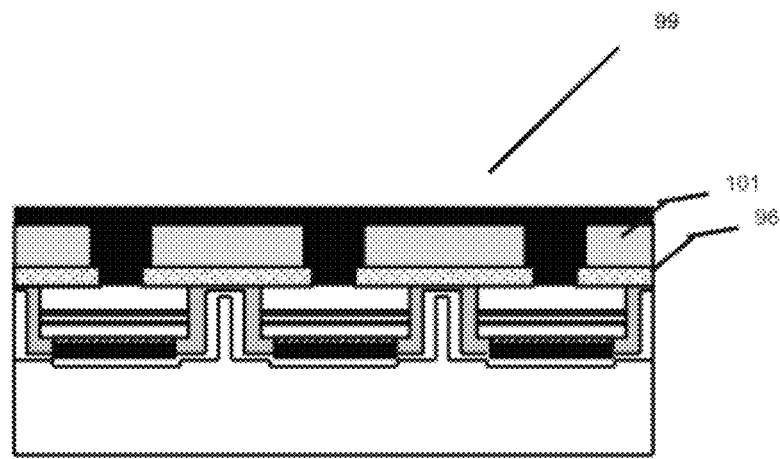
FIG. 8 shows a metal contact layer deposited on the patterned phosphor coating of FIG. 7, in accordance with one embodiment of the invention.
Figure 9:
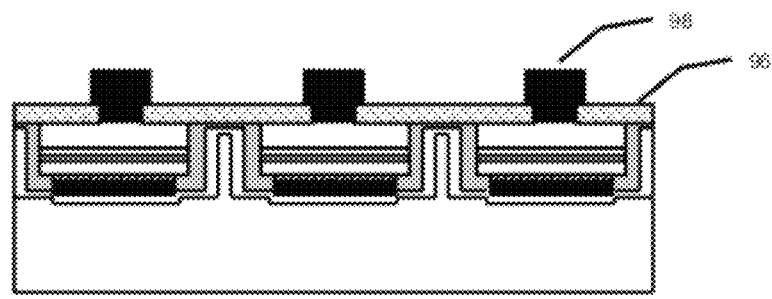
FIG. 9 shows patterned metal bond pads and a phosphor coating covering the LED wafer, in accordance with one embodiment of the invention.

In FIG. 8, a contact metal layer 99 such as Ni/Cr (Ni is in contact with n-GaN) is deposited on top of the photoresist masking layer, coupled with phosphor layer 96 and in contact with n-GaN 80. Metal layer 99 can be deposited using CVD, PVD, or ebeam evaporation.

In FIG. 8, a bonding pad 98 is formed above the patterned phosphor layer 96 to form an n-pad. The bond pad metal 98 is formed by lift-off techniques during the removal of the photoresist masking layer 101 using an aqueous solution such as diluted KOH. The process for phosphor coating and bonding pad can be exchanged, wherein the n-GaN contact metal 99 is patterned, dry etched and protected first by a photoresist masking layer before the phosphor layer 96 is applied and patterned by lift-off technique during the removal of the photoresist masking layer protecting the bond pad 98 using an aqueous solution, such as diluted KOH.

Figure 10:
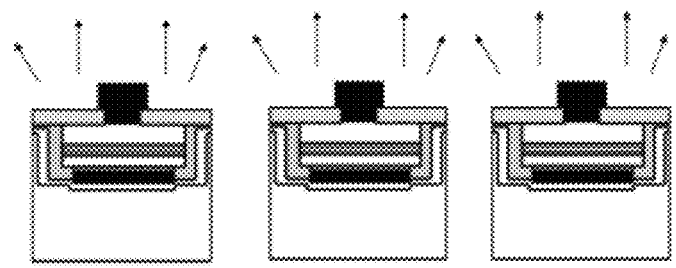
FIG. 10 shows a plurality of phosphor-coated LEDs, in accordance with one embodiment of the invention.

FIG. 10 shows a plurality of white LED chips. The phosphor-coated LED wafer is diced into white chips (i.e., individual LED dies), which can be packaged directly without phosphor addition at the chip level. The phosphor coating is integrated into the n-side-up vertical LED of wafer-level process. Then the white-light wafer is diced into separated white-LED chips by laser or saw.

Although a single phosphor layer is described above, multiple phosphor layers can be used. For example, a red photosensitive phosphor powder composition (phosphor slurry) can be applied to the entire surface, exposed to light and developed. Then, a green photosensitive phosphor powder composition (phosphor slurry) can be applied to the entire surface, exposed to light and developed, and then a blue photosensitive phosphor powder composition (phosphor slurry) is applied to the entire surface, exposed to light and developed.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

The invention claimed is:

1. A vertical light-emitting diode (LED) comprising:
   metal substrate;
   a p-GaN layer on the metal substrate;
   an active region for emitting light on the p-GaN layer;
   an N-GaN layer on the active region; and
   a spin coated phosphor layer on the n-GaN layer configured to change a wavelength of the light emitted by the active region to produce a white light, the spin coated phosphor layer comprising a phosphor powder and an organic chemical having a pre-cured viscosity selected to provide a predetermined thickness and color coordination for the white light.

2. The vertical light-emitting diode (LED) of claim 1 wherein the metal substrate comprises a deposited layer.

3. The vertical light-emitting diode (LED) of claim 1 wherein the metal substrate comprises an element selected from the group consisting of Ag, Al, TiW, W, Mo, Ta, and TaN.

4. The vertical light-emitting diode (LED) of claim 1 further comprising a p-contact configured as a light reflector between the metal substrate and the p-GaN layer.

5. The vertical light-emitting diode (LED) of claim 1 wherein the spin coated phosphor layer comprises a patterned layer.

6. The vertical light-emitting diode (LED) of claim 1 wherein the spin coated phosphor layer comprises a dry-etched layer.

7. The vertical light-emitting diode (LED) of claim 1 further comprising a metal bond pad coupled to the n-GaN layer through the spin coated phosphor layer.

8. The vertical light-emitting diode (LED) of claim 1 wherein the spin coated phosphor layer contacts a surface of the n-GaN layer.

9. The vertical light-emitting diode (LED) of claim 1 wherein a surface of the n-GaN layer comprises a substantially smooth and planar surface.

10. A vertical light-emitting diode (LED) comprising:
    a metal substrate;
    a p-GaN layer on the metal substrate;
    an active region for emitting light on the p-GaN layer;
    an n-GaN layer on the active region;
    a first spin coated phosphor layer on the n-GaN layer; and
    a second spin coated phosphor layer on the first phosphor layer,
    the first spin coated phosphor layer and the second spin coated phosphor layer configured to change a wavelength of the light emitted by the active region to produce a white light, the first spin coated phosphor layer and the second spin coated phosphor layer comprising a phosphor powder and an organic chemical having a pre-cured viscosity selected to provide predetermined thicknesses and a predetermined color coordination for the white light.

11. The vertical light-emitting diode (LED) of claim 10 wherein the first phosphor layer and the second phosphor layer comprise patterned layers.

12. The vertical light-emitting diode (LED) of claim 10 wherein a surface of the n-GaN layer comprises a substantially smooth and planar surface.

* * * * *